United States Patent [19]

Yoshino et al.

[11] Patent Number: 4,979,465

[45] Date of Patent: Dec. 25, 1990

[54] APPARATUS FOR PRODUCING SEMICONDUCTORS

[75] Inventors: Akira Yoshino; Kenji Okumura; Yoshinori Ohmori; Toshiharu Ohnishi, all of Osaka, Japan

[73] Assignee: Daidousanso Co., Ltd., Osaka, Japan

[21] Appl. No.: 457,140

[22] Filed: Dec. 26, 1989

[30] Foreign Application Priority Data

Apr. 3, 1989 [JP] Japan ................................ 1-39862[U]
Apr. 10, 1989 [JP] Japan ..................... 1-91651

[51] Int. Cl.$^5$ ............................................ C23C 16/46
[52] U.S. Cl. .................... 118/717; 118/715; 118/725
[58] Field of Search ............... 118/715, 723, 725, 719

[56] References Cited

U.S. PATENT DOCUMENTS

| | | | |
|---|---|---|---|
| 3,704,987 | 12/1972 | Arndt | 118/725 |
| 3,717,439 | 2/1973 | Sakai | 118/725 |
| 4,434,742 | 3/1984 | Henaff | 118/723 |
| 4,508,054 | 4/1985 | Baumberger | 118/715 |
| 4,751,372 | 6/1988 | Fraas | |
| 4,825,809 | 5/1989 | Mieno | 118/715 |
| 4,838,201 | 6/1989 | Fraas | 118/725 |

FOREIGN PATENT DOCUMENTS

WO87/7310 12/1987 PCT Int'l Appl. ................ 118/715

*Primary Examiner*—Richard Bueker
*Attorney, Agent, or Firm*—Armstrong, Nikaido, Marmelstein, Kubovcik, & Murray

[57] ABSTRACT

The present invention relates to an apparatus for producing semiconductors utilizing vacuum chemical epitaxy (VCE) method.

Said VCE method has a high utilization efficiency of reactant gas and can finish the surface of a semiconductor layer formed on the surface of a substrate smoothly in comparision with a conventional Metalorganic Chemical Vapor Deposition Method(MOCVD). However, in case of forming semiconductor layer on the surface of a substrate with a large area, it is impossible to form homogeneous semiconductor layer.

According to the present invention, a reactant gas dispersing chamber is disposed under a reaction chamber disposed within a vacuum chamber, the both chambers are communicated by a plurality of communicating holes, a feeding pipe for supplying reactant gas is extended into the reactant gas dispersing chamber, an end opening thereof is faced downward and a color portion is formed in parallel at the circumference of the end opening. Said reactant gas is blown off downward from the end opening of the feeding pipe and dispersed in parallel along the collar portion and dispersed homogeneously in the reactant gas dispersing chamber, and in the state, is introduced to the reaction chamber via said communicating holes. Therefore, even if on a substrate with a large area, homogeneous semiconductor layer can be formed.

3 Claims, 7 Drawing Sheets

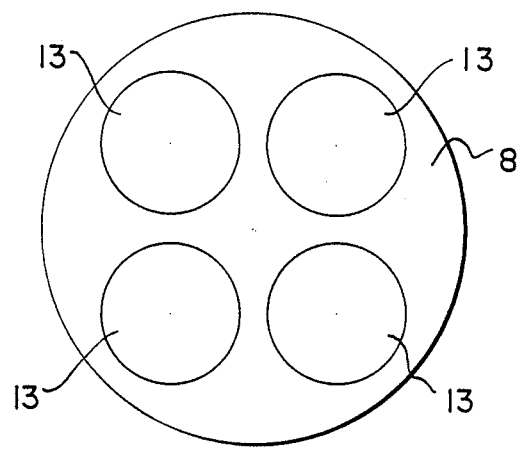
FIG. I(B)
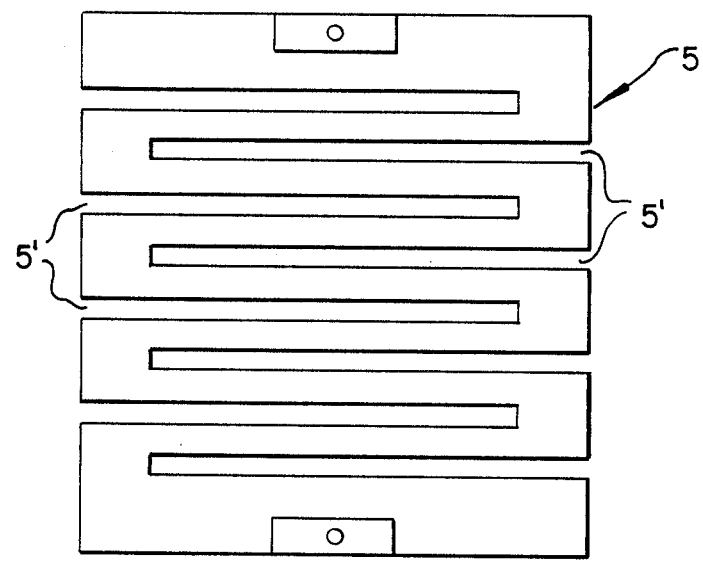
FIG. I(C)

APPARATUS FOR PRODUCING SEMICONDUCTORS

FIELD OF THE INVENTION

This invention relates to an apparatus for producing semiconductors wherein compound semiconductor layers are grown in a vacuum chemical epitaxy (VCE) system.

BACKGROUND OF THE INVENTION

In recent years, the demand for compound semiconductors especially Group III-V compounds (e.g. GaAs) has been growing because of their being superior in performance charcteristics to the conventinal silicon semiconductors. For the production of such Group III-V compound semiconductors, there are known, among others, the so-called molecular beam epitaxy (MBE) process which comprises causing atoms required for a compound to be epitaxially grown to evaporate from a solid material using a heat gun and causing them to collide, in the molecular beam form, against a substrate in an ultrahigh vacuum to thereby cause growth of a film of said material on said substrate, and the so-called metal organic chemical vapor deposition (MOCVD) process which comprises introducing the vapor of methyl-metal or ethyl-metal compound into a reaction chamber at atmospheric pressure or under reduced pressure by means of a carrier gas such as $H_2$, allowing said vapor to mix with a Group V metal hydride and allowing the reaction therebetween to take place on a heated substrate for crystal growth.

However, the MBE process among said two processes is not suited for a large-scale production, hence can hardly meet the needs of the market because ① it requires about $10^{-11}$ Torr of ultra-high vacuum, ② downtime generates when refilling material and ③ it requires a substrate rotating mechanism in order to conduct a homogeneous growth. Therefore, MOCVD process is now paid attention and practically used. However, it has disadvantages in that ① a distribution is easily caused in a flow direction and it is difficult to analyze the flow at a scale-up since it is a process in a laminar flow area and ② reactant gas is expensive and the utilization efficiency of the reactant gas is low because of the growth mechanism. Since a large quantity of unreacted gas, which is toxic, is produced because of the efficiency of reactant gas utilization being low, as mentioned above, since the carrier gas constitutes an additional waste gas portion, a large quantity of a toxic waste gas is discharged, and this fact leads to waste gas disposal problems.

Thus, since each of the MBE process and the MOCVD process have disadvantages respectively, it is desired to provide an apparatus for producing semiconductors removed these disadvantages completely. Accordingly, the inventors succeeded in developing an apparatus for producing semiconductors in which advantages of both MBE and MOCVD process are incorporated and filed a patent application (Japanese patent application No. 63-191060). The structure of this apparatus is shown in FIGS. 5 and 6. In these figures, the reference numeral 101 indicates the vacuum chamber of vacuum chemical epitaxy, the vacuum chamber 101 has a reaction chamber 102 therein, which is formed by a base plate 106, surrounding walls 107 and a top plate 108 placed, slidably in one direction, on the upper edges of the surrounding walls 107. The top plate has, in the middle portion thereof, openings 108a. Disc-form GaAs substrates 113 are detachably mounted on the openings 108a respectively. The surrounding walls of the reaction chamber 102 have exhaust ports 110 at certain given intervals around the same. The total area of these exhaust ports 110 is preferably about 4% of the surface area of the top plate 108 of the reaction chamber 102. The base plate 106 has nozzle openings 109 formed at predetermined intervals therein, which are in communication with openings 109 or 134 in the ceiling of a first dispersing chamber 104 disposed under the reaction chamber 102. Each opening 109 is in communication with the first dispersing chamber 104, whereas each opening 134 is in communication with a second dispersing chamber 124 via a duct 119 which passes through the first dispersing chamber 104. The first dispersing chamber 104 is in communication with a starting material inlet tube 121. Said starting material inlet tube 121 serves for introducing into the first dispersing chamber 104 a Group III compound (reactant gas) such as trimethylgallium (TMGa) or triethylgallium (TEGa). The second dispersing chamber 124 has an opening in the lower part, and an exhaust valve 136, suitably a poppet valve, is disposed displaceably in said opening for opening or closing said opening. Said second dispersing chamber 124 is in communication, through one side wall thereof, with a starting material inlet tube 121. Through said inlet tube 121, an n-type or p-type dopant or a Group III compound such as triethylaluminum (TEA l) enters the second dispersing chamber 124. A feeding tube 142 for feeding a Group V compound such as $AsH_3$ to the reaction chamber 102 has a plurality of holes 142a and 142b at certain definite intervals and in two rows (right and left). A heater 105 is disposed above the top plate 108 of the reaction chamber 102, with a leveling plate 105c. In this apparatus for MESFET epitaxy layer growth, the reaction chamber 10 is fitted with the substrates 113 (the surfaces face below respectively) thereon, then, the vacuum chamber 101 is evacuated to a vacuum of less than $10^{-7}$ Torr and the heater 105 is electrically loaded so that the heater 105 can generate heat. A Group V compound, such as $AsH_3$ is fed to the feeding tube 142 with the substrate temperature 500° C., so that it enters the reaction chamber 102 through the holes 142a and 142b. The Group V compound thus fed to the reaction chamber 102 flows toward the exhaust ports 110 across the surfaces of the substrates 113. During the flow, $AsH_3$ or TEAs is collided against the walls of the reaction chamber, which are hot walls, many times and thermally cracked to give $As_2$. After the temperature of the substrates reaches predetermined process temperature (600°~650° C.), a Group III compound such as triethylgallium (TEGa) is supplied into the first dispersing chamber 104 from the starting material inlet tube 121 of the reaction chamber 102, is mixed homogeneously and then is blown toward the substrates 113 from nozzles 109 in a homogeneous molecular density. At this time, since the mean free path of molecules of the Group III compound is set longer than the distance from orifice to wafer, the molecules of the Group III compound reaches substrates without having dispersion by collision between material molecules. The molecule of the Group III compound, together with $As_2$, come into contact with the surface of the substrates 113 and grows on said surface in the form of an undoped gallium arsenide (GaAs) layer or the like. The unconsumed compound that has not come into contact with the substrates 113 leaves the reaction chamber via the exhaust ports 110 and enters the vacuum chamber 101, which they then leave laterally under the action of an exhaustion means. Then, an n-type dopant, either alone or in admixture with the above-mentioned Group III or V compound, is fed to the reaction chamber 102 from the second dispersing chamber 124 so that an n-type active layer can grow on the surface of said undoped GaAs layer. Thereafter, all the gas supplies are discontinued and the system is maintained as it is for about 15 minutes. Then, the substrates 113 are cooled and then taken out of the reaction chamber 102 (hence, from the vacuum chamber 101). In this way, Group III-V compound semiconductors layer can be obtained.

However, in the apparatus for producing semiconductors with said structure, when growth of substrates with large area or a plurality of substrates is conducted, that is, when the distance between a supplying tube and exhaust ports becomes long, there is a disadvantage in that the distribution of the molecular density of the Group V compound is caused between a supplying tube of Group V compound such as $AsH_3$ and the exhaust ports, and thereby it is difficult to form an homogeneous semiconductor layer in some case (when the layer grows at low V/III ratio). As shown in FIG. 7, since peripheral part of the substrates 113 are supported by substrate holding part comprising a supporting part 108b along the whole circumference, molecular beams which go upward as an arrow mark from the lower part of the reaction chamber 102 are obstructed by said supporting part 108b and do not reach the peripheral part of the substrates 113. Therefore, the peripheral parts of substrates 113, as shown in FIG. 8, are left as untreated part and are thus uneconomical.

Accordingly, it is an object to provide an apparatus for producing semiconductors which can distribute all the reactant gas into the reaction chamber in a homogeneous state.

SUMMARY OF THE INVENTION

The present invention provides a modified semiconductor production apparatus provided with a vacuum chamber, a reaction chamber disposed within said vacuum chamber, substrate holding means disposed at a ceiling portion of said reaction chamber so as to hold the substrates in a state such that the substrates contact a reacting space, a substrate heating means disposed at the upper part of said reaction chamber for heating said substrates, a reactant gas dispersing chamber disposed under said reaction chamber, a plurality of communicating holes disposed at the border part between said reactant gas dispersing chamber and reaction chamber at predetermined intervals on the whole surface to communicate the two chambers, a first reactant gas feeding pipe of which one end extends into said reactant gas dispersing chamber and opens toward the bottom surface of reactant gas dispersing chamber, a collar portion disposed in parallel at the peripheral portion of said end opening of said first reactant gas feeding pipe, a second dispersing chamber disposed under said reactant gas dispersing chamber, a plurality of communicating pipes extended from the ceiling portion of said second dispersing chamber into said each communicating hole of said reactant gas dispersing chamber respectively so that a clearance can be made between itself and the hole wall, and a second reactant gas feeding pipe for supplying second reactant gas to said second dispersing chamber.

In the accompanying drawings,

FIG. 1(A) illustrates, in sectional view, the constitution of an embodiment according to the present invention, FIG. 1(B) illustrates, in plan view, the substrate holding part thereof, FIG. 1(C) illustrates, in enlarged plan view, the heater thereof, FIG. 2 illustrates, in vertical section, the substrate holding part thereof, FIG. 3 illustrates, in plan view, an arrangement state thereof, FIG. 4 illustrates, in sectional view, a constitution of another embodiment of the present invention, FIG. 5 illustrates, in sectional view, a prior art apparatus which is a basis of the present invention, FIG. 6 illustrates, in enlarged view, a main part of the apparatus of FIG. 5, FIG. 7 illustrates, in sectional view, a substrate holding part of the apparatus of FIG. 5, and FIG. 8 illustrates, in plan view, a holding state of the apparatus of FIG. 5.

DETAILED DESCRIPTION OF THE INVENTION

Figure 1A:
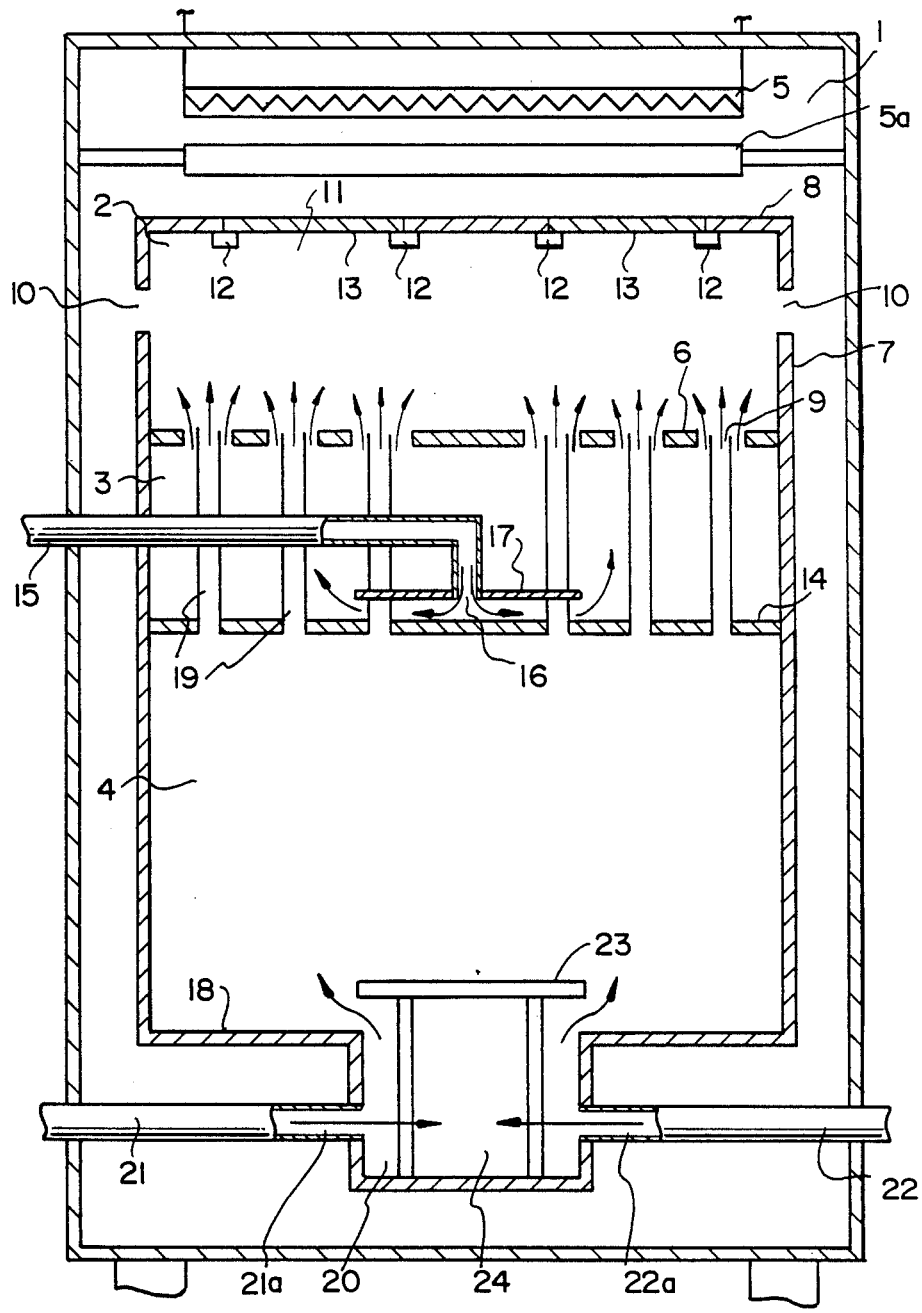

In an apparatus for producing semiconductors according to the present invention, a reactant gas dispersing chamber is newly provided at the lower part of a reaction chamber, a first reactant gas feeding pipe is extended into said reactant gas dispersing chamber and an end opening thereof is faced toward the bottom surface of said reactant gas dispersing chamber and a collar portion is formed in parallel around the periphery of the end opening. Therefore, a first reactant gas, such as $AsH_3$, blows off into the reactant gas dispersing chamber having a gas dispersing effect downwardly, and then comes in contact with a collar portion, extends in parallel and in all direction along the collar portion to disperse homogeneously in said reactant gas dispersing chamber, and then is supplied to the reaction chamber via communication holes disposed at the border between the reactant gas dispersing chamber and the reaction chamber. So that reactant gas is supplied to the reaction chamber in a uniform molecular beam state. That is, in the apparatus for producing semiconductors, by operations of a downward opening of the first reactant gas feeding pipe, a collar portion disposed at the circumference of said opening, a reactant gas dispersing effect of the reactant gas dispersing chamber, and a plurality of communicating holes disposed in the whole surface at predetermined intervals at a border portion between the reactant gas dispersing chamber and the reaction chamber, a Group V reactant gas such as $AsH_3$ is supplied to the reaction chamber in a uniform molecular beam state.

Second reactant gas such as TEAl and the like and third reactant gas such as TEGa and the like are mixed in a second dispersing chamber disposed under the reactant gas dispersing chamber, and the mixture is homogeneously supplied into said reaction chamber via the communicating pipes. In this case, a recess is formed at the bottom of the second dispersing chamber and an obstructing plate is disposed about above an opening of said recess to form a space made by the recess and the obstructing plate as a third dispersing chamber. Said second reactant gas feeding pipe and the third reactant gas feeding pipe are disposed at the surrounding walls of the third dispersing chamber in a state that openings of those pipes face each other. When second and third reactant gas are supplied to said second dispersing chamber from the clearance between the obstructing plate of said second dispersing chamber and opening of said recess after blowing off both second and third gases from said both openings of each feeding pipe and the mixing, mixing of both gases are well-done. When cuttings of which the diameter is almost the same as that of substrates are formed at the ceiling portion of said reaction chamber and substrate holding pieces are disposed at peripheral portion of the cuttings which face to the reaction chamber at predetermined intervals along the circumference of the cuttings, almost all of the substrate surface can be utilized to form semiconductor layer because the part of the substrate hidden by the substrate holding piece is remarkably reduced in comparison with a case that the holding part is disposed at whole part of cutting circumference.

Following examples will illustrate the invention in detail.

Figure 2:
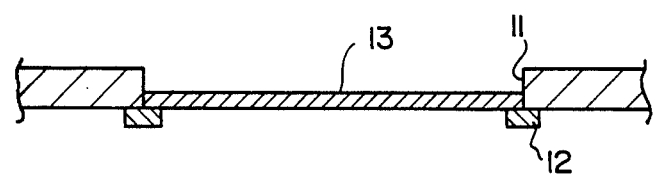
Figure 3:
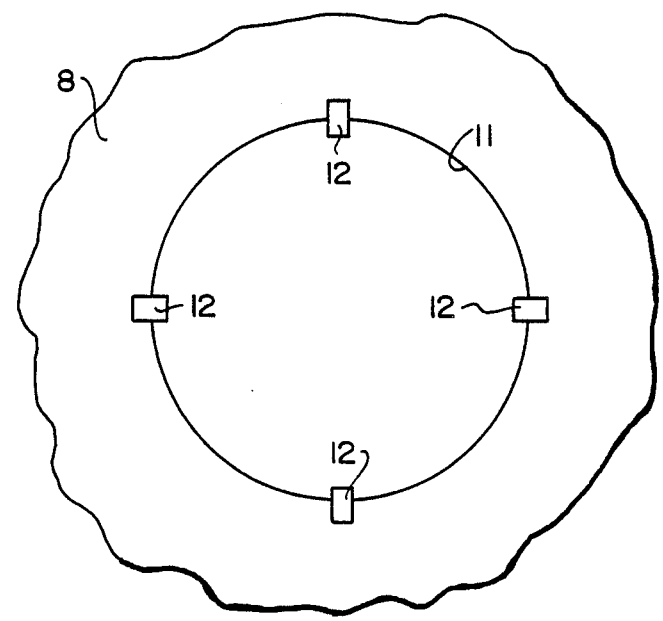

(A), (B) & (C) of FIG. 1 illustrate structure of an embodiment of the present invention. In FIG. (A), the reference numeral 1 indicates a cylindrical vacuum chamber made of stainless steel of vacuum chemical epitaxy system. The inside thereof is evacuated by a vacuum exhaustion system (not shown in the figure) disposed at the bottom side of the vacuum chamber. In this vacuum chamber 1, a carbon graphite reaction chamber 2, of which the wall surfaces are coated with silicon carbide, a reactant gas dispersing chamber 3, made of carbon graphite as well as said reaction chamber 2, and a second dispersing chamber 4 made of stainless steel are integrally disposed. The reaction chamber 2 is constructed of a base plate 6, a surrounding wall 7 and a ceiling plate 8. The wall surface of the reaction chamber 2 is made of carbon graphite so that the wall surface becomes a hot wall by heating with a heater 5 to reflect molecular grain without adhering thereto even if a molecular beam of the reactant gas collides with the wall surface. A plurality of communicating holes 9 are formed in said base plate 6 at predetermined intervals. The reaction chamber 2 and the reactant gas dispersing chamber 3 thereunder thereby communicated with each other. An exhaust port 10 is formed at the upper part of said surrounding wall 7 along its circumference in a linear state. Four round holes 11 are formed in said ceiling plate 8 as shown in FIG. 1(B). Substrate supporting pieces 12 are protruded at the lower peripheral portion of each hole 11 at 90° intervals in a circumferential direction as shown in FIGS. 2 and 3. The substrate holding part comprises the four substrate supporting pieces 12. Round substrates 13 are placed replaceably over said holes 11 and are supported by said substrate supporting pieces 12.

Said reactant gas dispersing chamber 3, disposed under the reaction chamber 2, comprises a base plate, a surrounding wall and a ceiling plate, which is a base plate 6 of the reaction chamber 2, and the wall surface thereof is considered to be a hot wall as well as said reaction chamber. A first reactant gas feeding pipe 15 is extended into the reactant gas dispersing chamber 3 from outside, the end part thereof is bent downwardly and an opening 16 therein opens downwardly. A disc-form collar portion 17 is formed at the peripheral portion of the opening 16 in parallel. The first reactant gas discharged from said opening 16 is thereby dispersed homogeniously in parallel and in all directions along the collar portion 17. A second dispersing chamber 4 is formed under the reactant gas dispersing chamber 3.

Said second dispersing chamber comprises a base plate 18, a surrounding wall 7 and a ceiling plate, which is the base plate 14 of the reactant gas dispersing chamber 3, and is made of stainless steel because it is less necessary to make the wall surface a hot wall. A plurality of communicating tubes 19 made of stainless steel are extended from the ceiling plate of the dispersing chamber 4 toward a plurality of communicating holes 9 formed on the ceiling plate 6 of the reactant gas dispersing chamber 3 respectively. In this case, a clearance is made between said communicating tube 19 and and hole wall of the communication hole 9 to which the communicating tube 19 is extended. The second dispersing chamber 4 and the reaction chamber 2 are communicated by said communicating tube 19 and the reactant gas dispersing chamber 3 and reaction chamber 2 are communicated by the clearances between the communicating tubes 19 and the hole walls of the communicating holes 9. A recess 20 is formed at the central portion of the bottom of said second dispersing chamber 4. End openings 21a and 22a of first and second feeding pipes 21, 22 open at opposite sides of surrounding wall portions in a state where both openings face each other. An obstructing plate 23 is disposed a little over the recess 20 in a state that the plate 23 faces the opening thereof. A third dispersing chamber 24 is formed by the obstructing plate 23 and said recess 20. Said second and third reactant gases are homogeneously mixed by operations of their blowing off pressure and the obstructing plate 23 in the third dispersing chamber 24 and the mixture enters into said second dispersing chamber 4 through said clearance between the obstructing plate 23 and said opening of the recess. Then said mixed gas reaches the reaction chamber 2 through said communicating tubes 19 after being further mixed homogeneously in the second dispersing chamber 4.

In FIG. 1(A), a reference numeral 5 indicates a plate type heater and 5a indicates a levelling plate. The temperature is set so that semiconductor compound can grow on the surface of the substrate 13 by heating mainly with radiant heat from the above. Said heater 5 is constructed by forming alternate stripe-form cuttings 5' on carbon graphite plate and disposing electrodes on both ends. While uniform planar heating is possible with such heater 5 alone, the use of the heat leveling plate 5a disposed below the heater 5 can make the planar heating more uniform.

In operation for MESFET epitaxy layer growth, the reaction chamber 2 is fitted with the substrates 13 (the surfaces face below respectively.) thereon. Then the vacuum chamber 2 is evacuated to a high vacuum state and the heater 5 is electrically loaded so that the heater 5 can generate heat. A Group V compound, such as $AsH_3$ is fed to the gas dispersing chamber 3 through the first reactant gas feeding pipe 15 with the substrate temperature at about 500° C. to provide a homogeneous dispersing state therein. Then it is fed into the reaction chamber 2 through communicating holes 9 formed in the surface of the reactant gas dispersing chamber at uniform intervals. In the reaction chamber 2, gas such as $AsH_3$ flows toward exhaust ports which are disposed in a linear state in the surface of the surrounding wall of the reaction chamber 2 along the circumference dispersedly contacting the surfaces of the substrates 13. During the flow, $AsH_3$ and the like is thermally cracked to give As$_2$. Thereafter, a Group III compound such as TEGa is fed into the third dispersing chamber 24 from the second reactant gas supplying tube 21 after the temperature of the substrates reaches a predetermined temperature (600°~650° C.) and at the same time the Group III compound, triethylaluminium (TEAl) is fed into the third dispersing chamber 24 and mixed with the former reactant gas. The mixture is fed into the second dispersing chamber 4 and it, together with As$_2$, comes into contact with the surface of the substrates and grows on said surface in the form of an undoped gallium arsenide (GaAs) layer or the like. The unconsumed compound that has not come into contact with the substrates 13 leaves the reaction chamber via the exhaust ports 10 under the action of an exhaustion means. In this case, since the exhaust port 10 is formed in a linear state in the surrounding wall of the reaction chamber 2 along the circumference, the exhaustion of the unconsumed gas is conducted through all circumference of the surrounding wall to thereby contribute to a homogeneous dispersion of the reactant gas in the reaction chamber. Then, an n-type dopant, either alone or in admixture with the above-mentioned Group III or V compound, is fed to the reaction chamber 2 from the second dispersing chamber 4 so that an n-type active layer can grow on the surface of said undoped GaAs layer. Thereafter, all the gas supplies are discontinued and the system is maintained for a predetermined time as it is and the substrates 13 are cooled and then taken out of the reaction chamber 2. Thus, semiconductors having a uniform MESFET semiconductor layer can be obtained.

In this way, according to the embodiment, since the rection chamber 2, whose capacity is smaller than the vacuum chamber 1, is disposed in the vacuum chamber 1 and the substrates are placed in the reaction chamber and in that state the reactant gas is supplied in a molecular beam state to let it grow, there is little wasted gas and utilization efficiency of the reactant gas is largely improved. In this apparatus, the vacuum chamber 1 can be evacuated to a high degree, the Group III compound, of which the evaporation pressure is low, can be used by gasifying it as is. Therefore, a carrier gas for carrying the compound is not necesary, so that exhaustion treatment of gas after use becomes small. Particularly in said apparatus, since the reactant gas dispersing chamber 3 is newly disposed, the first reactant gas supplying tube 15 is disposed downwardly, and the end opening 16 thereof has a collar portion 17, the reactant gas therein is in a homogeneously dispersed state. Therefore, the reactant gas is supplied into the reaction chamber 2 in a homogeneous state, so that formation of a homogeneous semiconductor layer can be carried out on a large area substrate and a plurality of substrates without rotating the substrate or suceptor. In said embodiment, four substrates 13 are used, but the number of substrates is not limited to this, either single or plural is all right.

Figure 4:
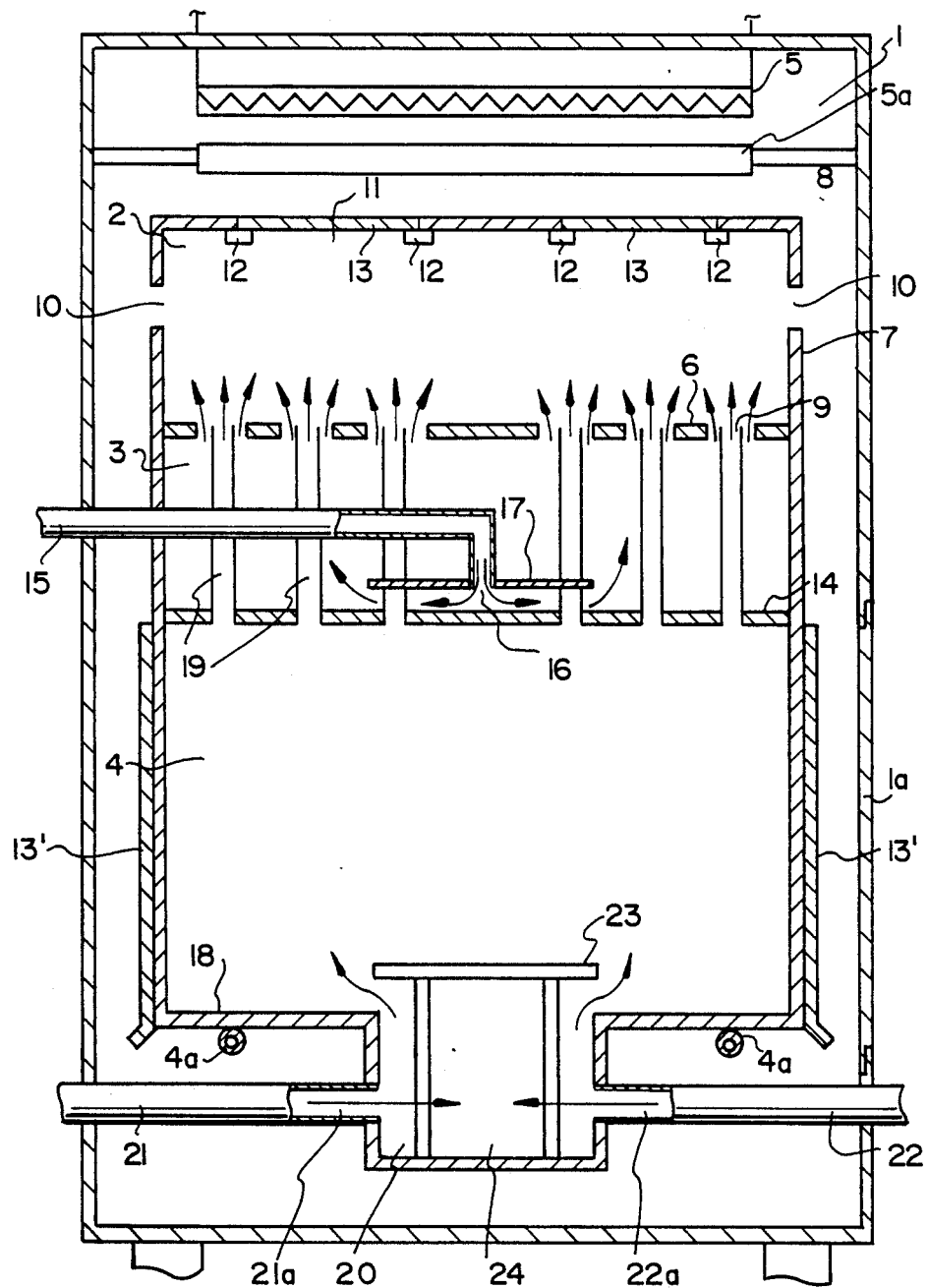
Figure 5:
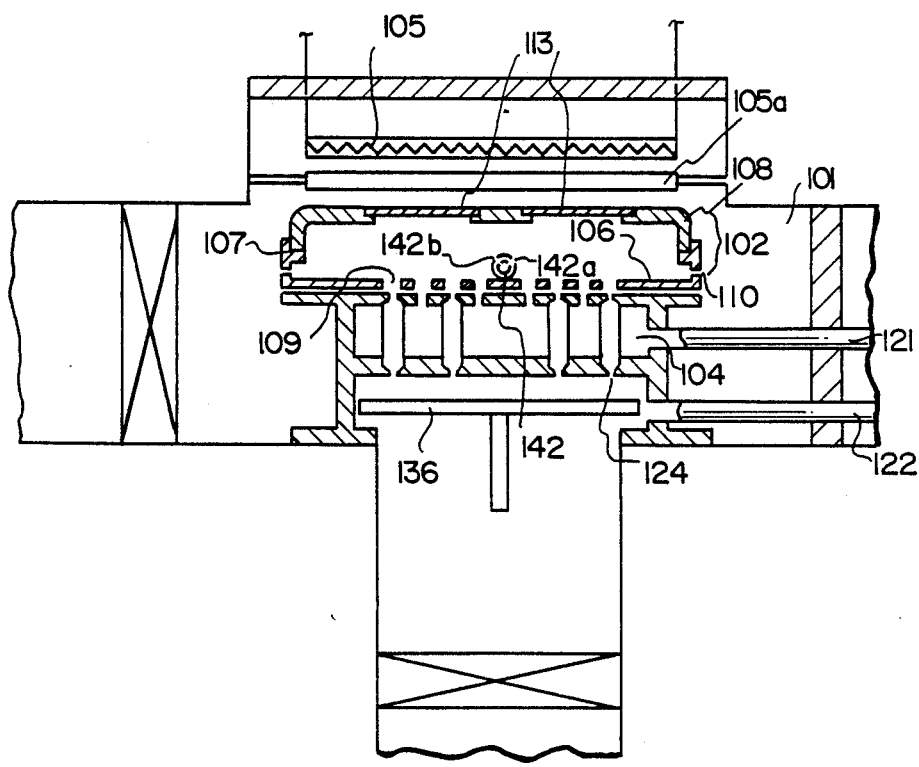
Figure 6:
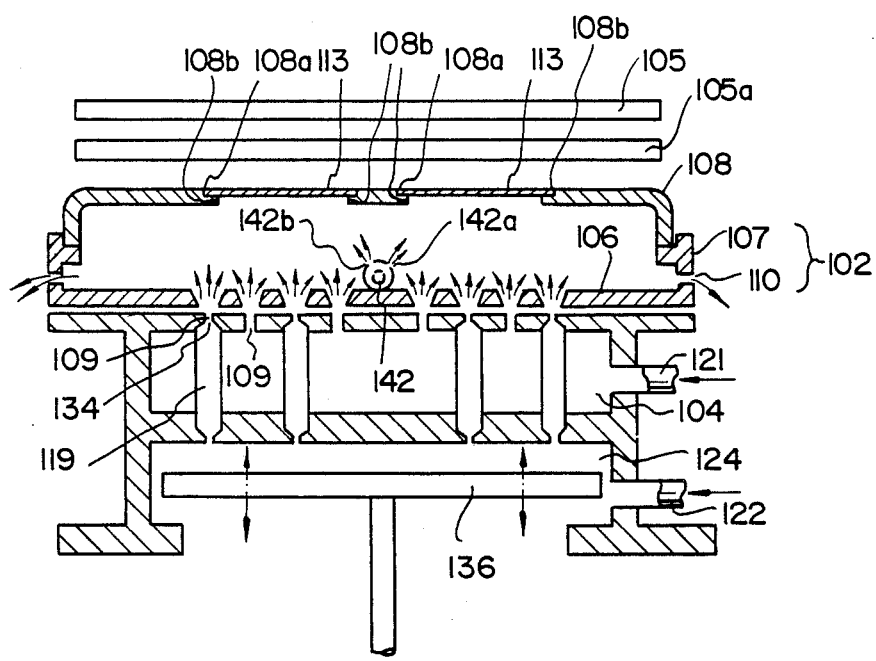
Figure 7:
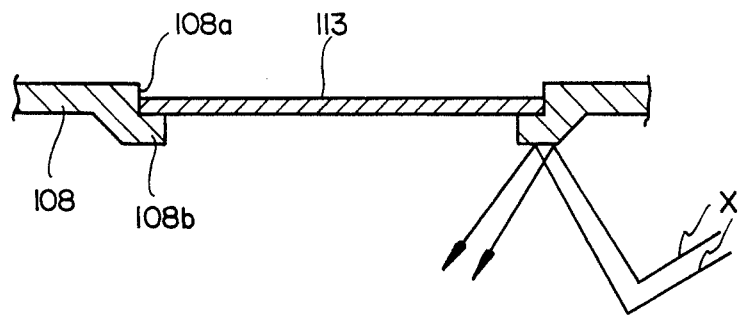
Figure 8:
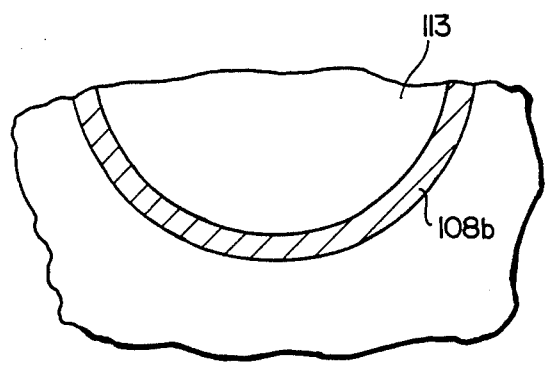

FIG. 4 shows another embodiment. In this embodiment, foil 13' made of metal, such as stainless steel and the like, is disposed cylindrically at the circumference of a second dispersing chamber 4 made of cheap stainless steel and fixed removably with a bis and the like. The lower portion of said cylindrically disposed foil 13' is formed skirt-like. The reference numeral 1 indicates a lid portion disposed at the part of the vacuum chamber 1 for disposing said foil 13'.

The numeral 4a indicates a cooling pipe made of stainless steel for cooling said dispersing chamber 4. Otherwise the apparatus is the same as FIG. 1(A).

As a result of this construction, since unconsumed reaction product which leaves from the reaction chamber 2 when forming semiconductor layer is adhered to the surface of the cylindrical foil 13', other parts in the vacuum chamber 1 is prevented pollution in a wide range. That is, since the temperature of the second dispersing chamber is rather lower than that of the reaction chamber 2, the unconsumed reactive material is adhered preferentially to said part of which the temperature is low. Therefore, the circumference of the dispersing chamber 4 is prevented from the pollution by said cylindrical foil 13'.

We claim:

1. An apparatus for producing semiconductors comprising a vacuum chamber, a reaction chamber disposed within said vacuum chamber, a substrate holding member depending from a ceiling portion of said reaction chamber adapted to hold said substrate; a substrate heating means disposed at the upper part of said reaction chamber adapted to heat said substrate; a first reactant gas dispersing chamber disposed below said reaction chamber; a plurality of communicating holes disposed at the border between said first reactant gas dispersing chamber and said reaction chamber at predetermined intervals in said border to communicate the two chambers; a first reactant gas feeding pipe having a first end extending into said first reactant gas dispersing chamber which is directed toward the bottom surface of said first reactant gas dispersing chamber; a collar portion disposed in parallel to said bottom surface at the peripheral portion of the opening of said first end; a second dispersing chamber disposed below said first reactant gas dispersing chamber; a plurality of communicating pipes extended from the ceiling portion of said second dispersing chamber through said first reactant gas dispersing chamber into said communicating holes peripherally spaced from the walls of said holes; and a second reactant gas supplying pipe adapted to supply a second reactant gas to said second dispersing chamber.

2. An apparatus for producing semiconductors as defined in claim 1, including a recess formed at the bottom portion of said second dispersing chamber, said second reactant gas supplying pipe and a third reactant gas supplying pipe disposed around a wall portion vertically disposed in said recess transverse to said second and third reactant gas supply pipes; and plate disposed on said wall portions above and facing said recess.

3. An apparatus for producing semiconductors as defined in claims 1 or 2, including at least one hole having a diameter slightly less than the diameter of said substrate formed in the ceiling of said reaction chamber and a substrate holding means comprising substrate supporting pieces formed at the periphery of said hole which faces into the reaction chamber along the circumference of said hole at predetermined circumferential intervals.

* * * * *